(12) United States Patent
Kondo (10) Patent No.: US 7,356,061 B2
(45) Date of Patent: Apr. 8, 2008

(54) MULTI-BEAM SEMICONDUCTOR LASER

(75) Inventor: Takashi Kondo, Yokohama (JP)

(73) Assignee: Samsung Electronics Co., Ltd, Suwon-Si (KR)

( * ) Notice: Subject to any disclaimer, the term of this patent is extended or adjusted under 35 U.S.C. 154(b) by 252 days.

(21) Appl. No.: 11/019,240

(22) Filed: Dec. 23, 2004

(65) Prior Publication Data

US 2005/0141581 A1    Jun. 30, 2005

(30) Foreign Application Priority Data

Dec. 24, 2003  (JP)  ............................. 2003-428130

(51) Int. Cl.
    *H01S 5/00*    (2006.01)
(52) U.S. Cl. .................. 372/45.01; 372/46.01
(58) Field of Classification Search ........... 372/46.014, 372/46.01, 39, 43.01, 75
See application file for complete search history.

(56) References Cited

U.S. PATENT DOCUMENTS

| | | | |
|---|---|---|---|
| 5,784,400 A | 7/1998 | Joannopoulos et al. | 372/96 |
| 2002/0154665 A1* | 10/2002 | Funabashi et al. | 372/45 |
| 2002/0163947 A1 | 11/2002 | Ostergaard et al. | 372/43 |
| 2002/0167984 A1 | 11/2002 | Scherer | 372/50 |
| 2003/0184845 A1* | 10/2003 | Kittaka et al. | 359/321 |

FOREIGN PATENT DOCUMENTS

| | | |
|---|---|---|
| JP | 05-215892 | 8/1993 |
| JP | 07-245448 | 9/1995 |
| JP | 08-186320 | 7/1996 |
| JP | 08-213709 | 8/1996 |
| JP | 10-144991 | 5/1998 |
| JP | 10-284806 | 10/1998 |
| JP | 2000-133879 | 5/2000 |
| JP | 2001-272555 | 10/2001 |
| JP | 2002-237657 | 8/2002 |
| JP | 2003-035846 | 2/2003 |
| KR | 1998-082331 | 12/1998 |
| WO | WO 03/067724 A1 | 8/2003 |

* cited by examiner

*Primary Examiner*—Minsun Oh Harvey
*Assistant Examiner*—Tuan N. Nguyen
(74) *Attorney, Agent, or Firm*—Roylance, Abrams, Berdo & Goodman, LLP

(57) ABSTRACT

Provided is a multi-beam semiconductor laser designed to change a pitch between laser beams while eliminating the risks of crosstalk and power-down. Reflective mirrors are disposed at either end surface of the laser oscillating region in the active layer formed along the striped current path, a reflective mirror located at a front surface has a reflectance sufficiently high to prevent emission of a laser beam from the front surface, and a wavelength demultiplexer is disposed at a location in each of the plurality of laser oscillating regions so as to change the direction of propagation of only laser oscillating wavelength beams for emission from the laser oscillating regions. The above construction allows adjustment of a pitch between laser beams.

7 Claims, 8 Drawing Sheets

MULTI-BEAM SEMICONDUCTOR LASER

CROSS-REFERENCE TO RELATED APPLICATIONS

This application claims the benefit under 35 U.S.C. §119 (a) of Japanese Patent Application No. 2003-428130, filed on Dec. 24, 2003, in the Japanese Patent Office, the entire disclosure of which is hereby incorporated by reference.

BACKGROUND OF THE INVENTION

1. Field of the Invention

The present invention relates to a multi-beam semiconductor laser with a plurality of laser emitting elements arranged one- or two-dimensionally. More particularly, the present invention relates to a multi-beam semiconductor laser constructed to freely change the pitch between beams.

2. Description of the Related Art

Figure 1:
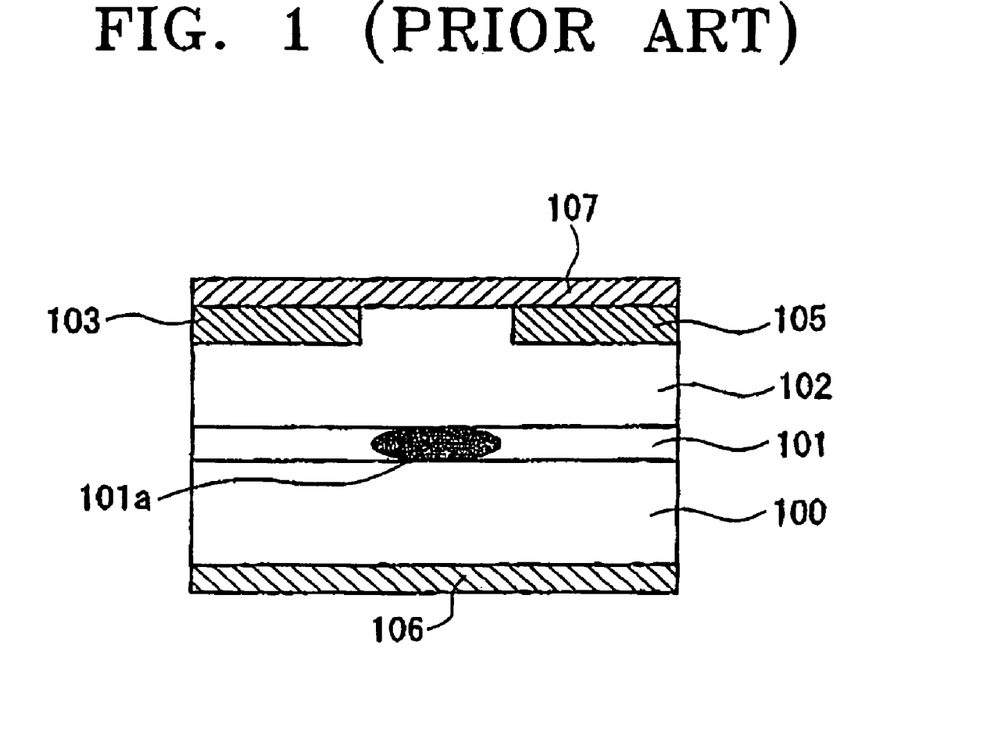
FIG. 1 shows a basic structure of a conventional semiconductor laser.

FIG. 1 shows a basic structure of a conventional semiconductor laser. Referring to FIG. 1, the semiconductor laser is formed from a stack of an n-cladding layer 100, an active layer 101, a p-cladding layer 102, insulating layers 103 and 105 respectively located on the sides of a mesa portion of the p-cladding layer 102, an n-electrode layer 106 formed on the bottom of the n-cladding layer 100, and a p-electrode layer 107 formed on the mesa portion of the p-cladding layer 102. While the n- and p-cladding layers 100 and 102 act to confine carriers or light, the intermediate active layer 101 generates laser energy.

The above-mentioned structure of the semiconductor laser allows the current from the electrode layer 107 to flow into only a striped region of the p-cladding layer 102 between the insulating layers 103 and 105, so that the active layer 101 adjacent to the striped region is activated to emit light from only end surfaces in the stack. Example of this type of structure has been disclosed in Japanese Patent Laid-open Publication Nos. hei 05-218592, hei 10-144991, and 2000-133879.

Figure 2:
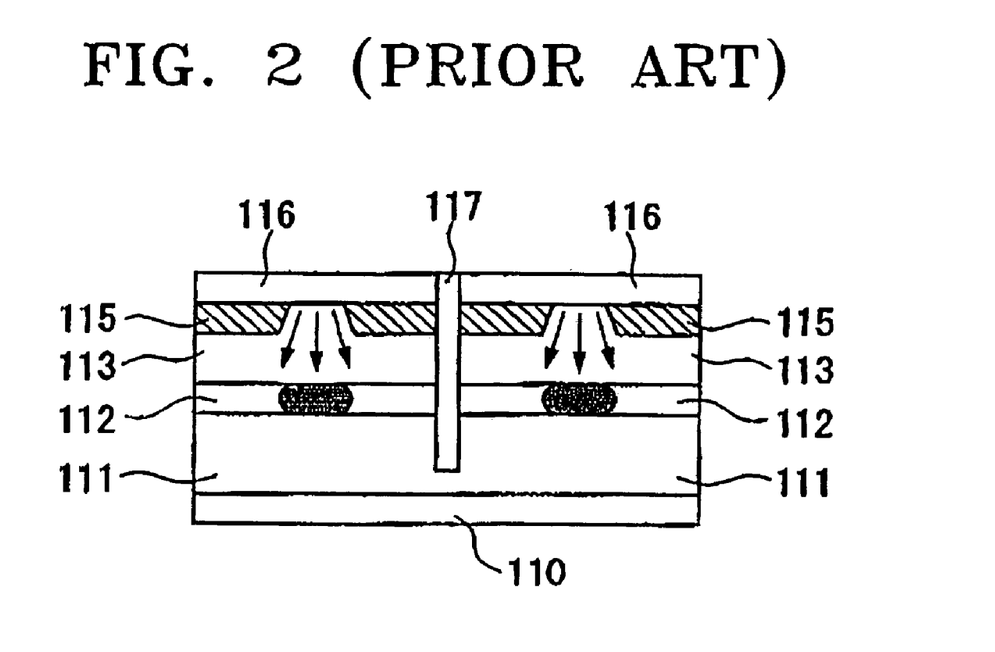
FIG. 2 shows an example of a conventional multi-beam semiconductor laser.

FIG. 2 shows an example of an edge-emitting multi-beam semiconductor laser with a structure improved over the conventional structures discussed in the above-cited references. Referring to FIG. 2, the edge-emitting multi-beam semiconductor laser includes an n-electrode layer 110, an n-cladding layer 111, an active layer 112, a p-cladding layer 113, an insulating layer 115, and an electrode layer 116 formed in a stack. The semiconductor layer further includes an insulating barrier layer 117 dividing the electrode layer 116, the insulating layer 115, the p-cladding layer 113, the active layer 112, and the n-cladding layer 111 into two regions in the depth direction. The presence of striped portions of the p-cladding layers 113 located in gaps of the two insulating layers 115 separated by the barrier layer 117 allow currents to be injected from the electrode layers 116 into the active layer 112 so that active regions within the active layer 112 emit multiple laser beams.

Figure 3:
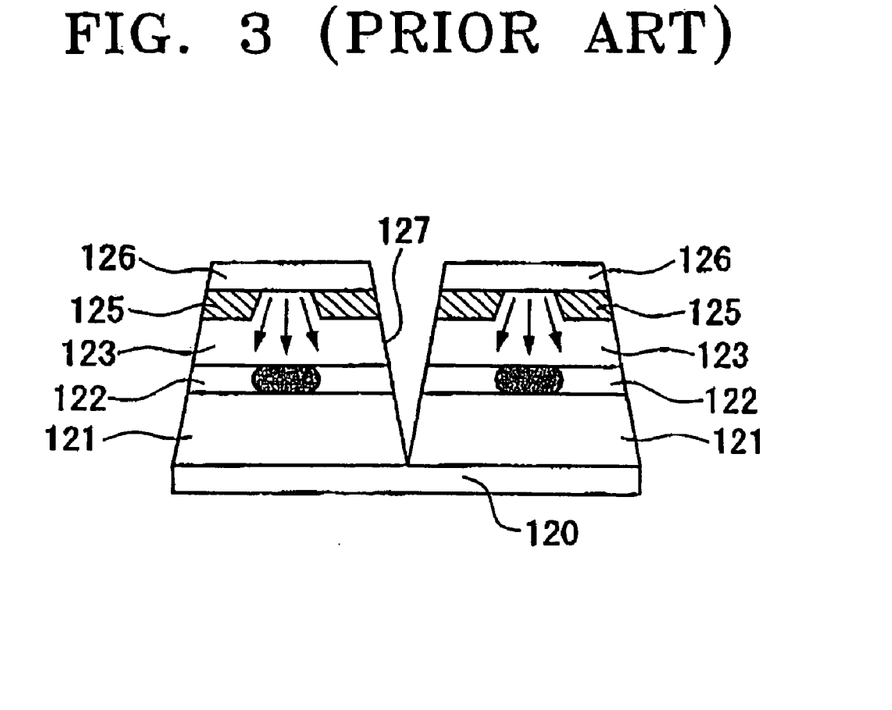
FIG. 3 shows another example of a conventional multi-beam semiconductor laser.

FIG. 3 shows another example of an edge-emitting multi-beam semiconductor laser. Referring to FIG. 3, like the semiconductor laser of FIG. 10, the edge-emitting multi-beam semiconductor laser includes a stack of an n-electrode layer 120, an n-cladding layer 121, an active layer 122, a p-cladding layer 123, an insulating layer 125, and a p-electrode layer 126. The semiconductor laser further includes a separation groove 127 partitioning the electrode layer 126, the insulating layer 125, the p-cladding layer 123, the active layer 122, and the n-cladding layer 121 into two parts in the depth direction. This structure allows current to be injected from striped portions of the p-cladding layer 123 located in gaps of the two insulating layers 125 separated by the separation groove 127 into the active layer 122 so that active regions within the active layer 122 emit multiple laser beams.

Figure 4:
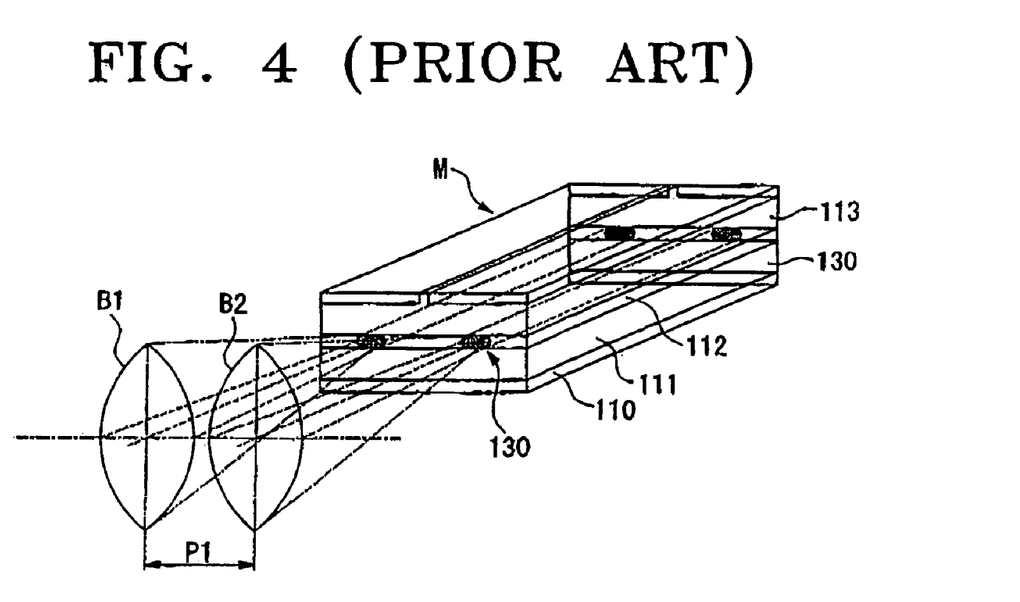
FIG. 4 shows an example of a laser beam emitted from a conventional semiconductor laser.

Despite the difference between the barrier layer 117 and the separation groove 127, the semiconductor lasers shown in FIGS. 2 and 3 are a multi-beam semiconductor laser M basically having mirrors on longitudinal end surfaces 130 of a stack in FIG. 4. When laser oscillation lasing takes place at a level higher than a threshold, a laser beam is emitted from the end surfaces 130 of the stack.

FIG. 4 shows a state in which emitted laser beams B1 and B2 are projected. A distance between the centers of the elliptical projected beams B1 and B2 is defined as the pitch P1 between the beams. There has been a need to modify the pitch P1 or reduce it as much as possible when the multi-beam semiconductor laser M is combined with a laser product.

Figure 5:
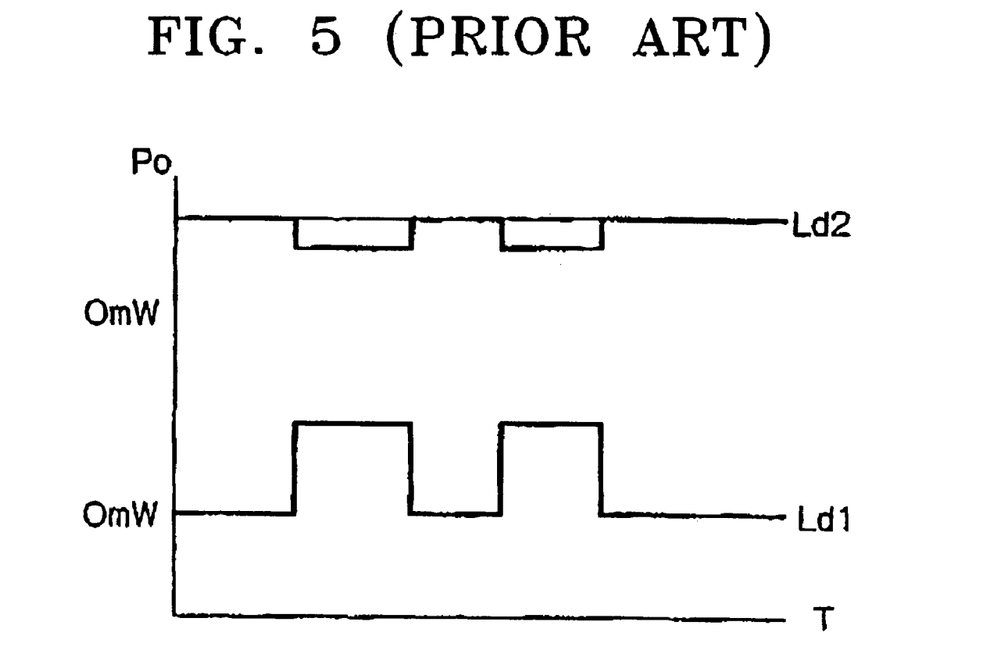
FIG. 5 shows an example of an output power waveform of a conventional semiconductor laser.

However, the conventional edge-emitting semiconductor lasers shown in FIGS. 2 and 3 have a problem in that an epitaxial growth process must be changed and the electrical characteristics, optical output power, and reliability characteristics of a laser must be reset each time the pitch P1 between beams changes. Another problem is that it is physically impossible to reduce the beam pitch P1 to less than the aperture of a waveguide, or in other words, the width of an active region within an active layer. Also, there are performance problems caused by thermal effects when reducing the beam pitch P1. For example, reducing the beam pitch P1 causes the output of an adjacent laser to change due to the thermal effect when a laser switches from "on" to "off" and vice versa. As a result, a laser diode Ld2 generates an output wave form as crosstalk that is affected by output wave form of another laser diode Ld1 as shown in FIG. 5, thereby, causing a possible power down of the dominant laser diode Ld1.

Accordingly, there is a need for a multi-beam semiconductor laser capable of changing the pitch of the laser beams without affecting the adjacent lasers.

SUMMARY OF THE INVENTION

The present invention provides a multi-beam semiconductor laser designed to freely change a pitch between laser beams while eliminating the risks of crosstalk and power-down.

According to an aspect of the present invention, there is provided a multi-beam semiconductor laser comprising an active layer, two cladding layers on either side of the active layer in a thickness direction, electrode layers formed outside of the cladding layers, a current-blocking region formed from an insulating layer at an interface between one of the two cladding layers and the electrode layer, a striped current path formed in the current-blocking region, and a plurality of light-emitting portions defining laser oscillating regions formed in the active layer along the current path. In the multi-beam semiconductor laser, reflective mirrors are disposed at either end surface of the laser oscillating region in the active layer formed along the striped current path. A reflective mirror located at a front surface has a reflectance sufficiently high to prevent emission of a laser beam from the front surface. A wavelength demultiplexer is disposed at a location in each of the plurality of laser oscillating regions so as to change the direction of propagation of only laser oscillating wavelength beams for emission from the laser oscillating regions.

The spacing between a plurality of laser beams, the propagation paths of which are changed by the plurality the wavelength demultiplexers disposed within the plurality of laser oscillating regions, is adjusted according to the location of each of the plurality of wavelength demultiplexers in the laser oscillating region.

The reflectance of the reflective mirror located at the front surface is approximately 100%. A path through which the laser oscillating wavelength beam passes is disposed in the direction of propagation of the laser oscillating wavelength beam changed by the wavelength demultiplexer. Furthermore, a grating is disposed on the path through which the laser oscillating wavelength beam whose propagation direction is changed by the wavelength demultiplexer passes and controls the radiation angle of a beam. The wavelength demultiplexer can be formed from photonic crystals.

BRIEF DESCRIPTION OF THE DRAWINGS

The above and other features and advantages of the present invention will become more apparent by describing in detail exemplary embodiments thereof with reference to the attached drawings in which.

It should be understood that the same reference numbers refer to similar features and structures throughout the drawings.

DETAILED DESCRIPTION OF THE EXEMPLARY EMBODIMENTS

Figure 6:
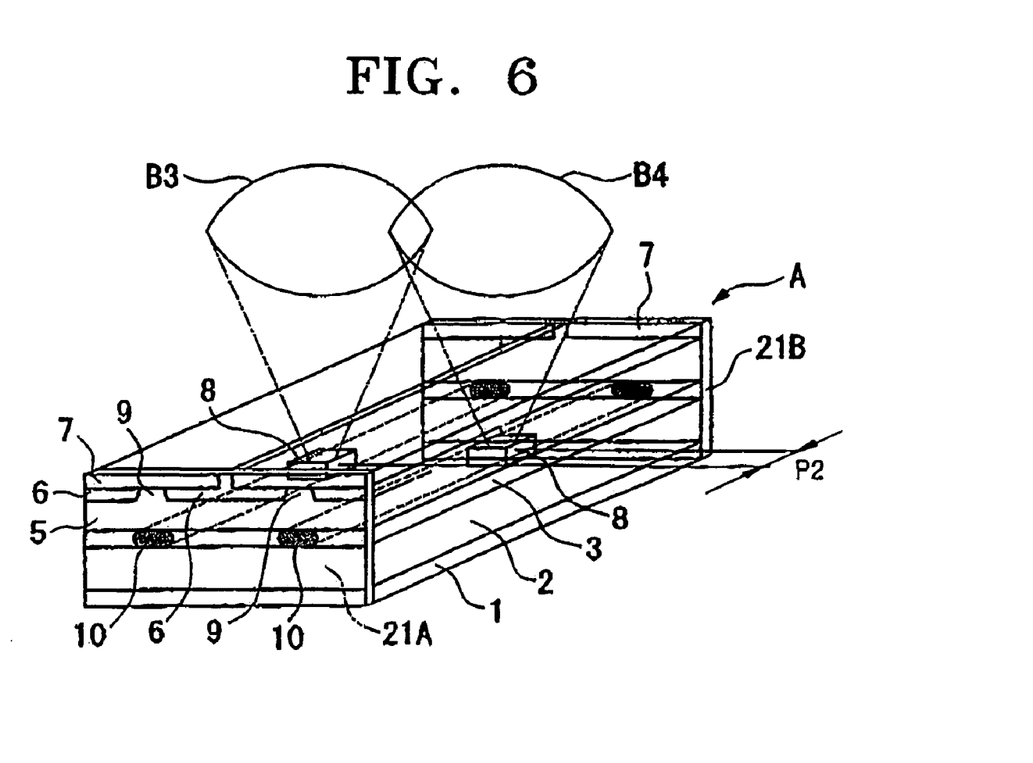
FIG. 6 shows a multi-beam semiconductor laser according to an embodiment of the present invention.

Referring to FIG. 6, a multi-beam semiconductor laser A according to an embodiment of the present invention comprises an n-electrode layer 1, and an n-cladding layer 2, an active layer 3, a p-cladding layer 5, a current-blocking region 6 and a p-electrode layer 7 sequentially formed on the n-electrode layer 1. A wavelength demultiplexer 8 is installed as a part of the active layer 3.

While the n-cladding layer 2 is made of an n-type semiconductor compound such as nInP, nGaAs, nGaAlAs, or nAlGaN, the p-cladding layer 5 is made of a p-type semiconductor compound such as pInP, pGaAs, pGaAlAs, or pAlGaN. The active layer 3 is made of a compound such as InGaAsP or GaAs. The n-cladding layer 2, the active layer 3, and the p-cladding layer 5 can be made of other materials that are commonly known as semiconductor-laser materials.

A pair of striped electrode layers 7 overlying the p-cladding layer 5 are horizontally separated from each other. A pair of the current-blocking regions 6 made of an insulating layer such as $SiO_2$, SiNx, or $Al_2O_3$ are formed at the bottom of both the electrode layers 7 so as to create striped current paths 9 in the p-cladding layer 5. A pair of striped laser oscillating regions 10 are in a portion of the active layer 3 corresponding to the striped current paths 9.

The wavelength demultiplexers 8, each consisting of photonic crystals (PCs) (to be described later in more detail), are respectively disposed at the longitudinal center of one of the pair of laser oscillating regions 10 and at a location deviating slightly from the longitudinal center of the other laser oscillating region 10.

As described in Japanese Patent Laid-open Publication No. 2001-272555, the wavelength demultiplexer 8 is a 2-dimensional PC structure based on a slab formed of a material having a higher refractive index than air, in which a material having a lower refractive index than the slab material is periodically arrayed to provide a refractive index distribution. A PC waveguide is created by forming a line defect, which functions as a waveguide, in the periodic array of photonic crystal, and at least one point defect is disposed adjacent the PC waveguide to act as a disorder in the periodic array of photonic crystal. The point defect functions as a light or electromagnetic wave outlet/inlet port for trapping light or electromagnetic wave of a selected wavelength from among light or electromagnetic waves propagating through the waveguide and radiating it, or trapping light or electromagnetic waves of a selected wavelength from the exterior and introducing it into the waveguide.

Figure 7:
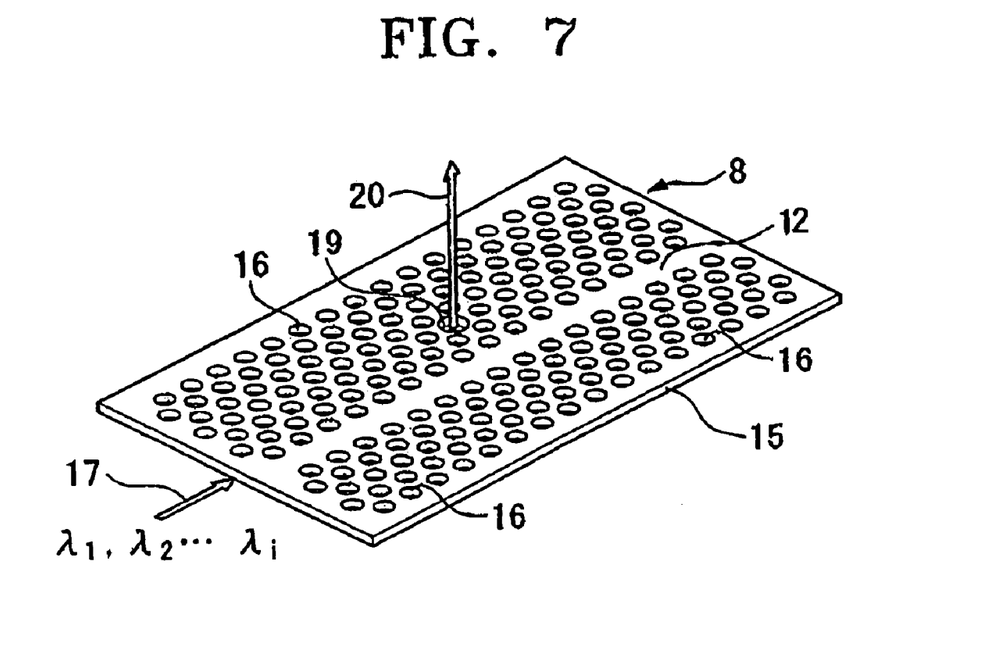
FIG. 7 is a perspective view of a wavelength demultiplexer consisting of photonic crystals used in the multi-beam semiconductor laser of FIG. 1.
Figure 8:
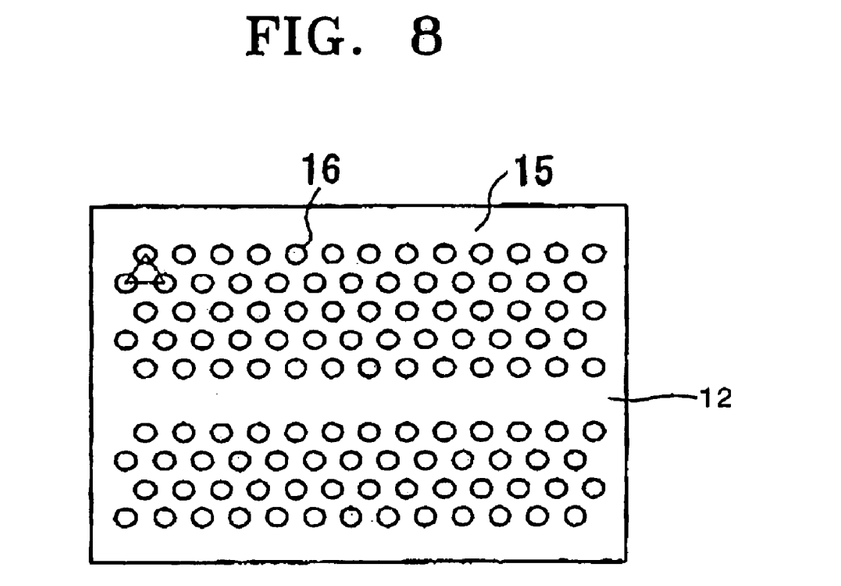
FIG. 8 is a plan view showing another example of a wavelength demultiplexer according to an embodiment of the present invention.

More specifically, the wavelength demultiplexer 8 is a two-dimensional (2-D) PC structure preferably having a bandgap in the in-plane direction due to the 2-D periodic distribution of refractive index. For example, referring to FIG. 7, the PC is structured such that circular holes 16 are arranged in a slab 15 in a tri-angular lattice pattern. In the 2-D PC, the incident light or the EM wave 17 ($\lambda_1, \lambda_2, \ldots \lambda_i$) within the crystal is prevented from propagating in the in-plane direction due to the bandgap, and can be confined in the orthogonal direction to the 2-D PC plane due to the total reflection by upper and lower low refractive index materials. Here, as shown in FIG. 8, a line defect 12 is introduced by linearly removing circular holes. In the line defect 12, a waveguide mode exists to create a waveguide.

A PC slab structure is desirably formed from a high refractive index material to confine EM waves in the upward and downward directions. While the slab is made of InGaAsP in the illustrative embodiment, it may be made of GaAs, a material containing one or at least two of In, Ga, Al, Sb, As, Ge, Si, P, N, and O, an inorganic material such as Si, particularly, an inorganic semiconductor material, or an organic material. As described above, the material of the slab may have a higher refractive index than air, which has a refractive index greater than 2.0, and preferably greater than 3.0.

As described above, the EM waves can be transmitted into a 2-D PC defect waveguide. In a linear waveguide, EM waves can be transmitted with low loss over a relatively large wavelength range. Thus, it is possible to totally reflect EM waves in a wavelength band containing several channel wavelengths back into the waveguide. By contrast, the existence of a point defect 19 near the waveguide as shown in. FIG. 7 allows EM waves 20 with a certain wavelength to be trapped within the defect region. While resonating within the defect, the light or EM waves 20 are emitted in upward and downward directions having a low Q factor due to the slab shape.

Thus, by designing a point defect in the 2-D PC so as to capture only a wavelength of a specific channel in a wavelength band, it functions not only as a light or EM wave outlet/inlet port, but also as a demultiplexer, a multiplexer or a filter for extracting EM waves with specific wavelengths. Thus, the 2-D PC slab can be used as the wavelength demultiplexer 8 according to an embodiment of the present invention. The structure allows in-plane waveguide EM waves to be guided in the direction perpendicular to the 2-D PC plane and enables formation of a branching or redirecting path within a minute region within a micro-area.

Referring to FIG. 7, since the point defect 19 lacks vertical symmetry, EM waves are emitted both upward and downward. By making the defect vertically asymmetrical, the EM waves can be emitted either upward or downward. To the end of incorporating asymmetry, for example, the cross-sectional shape of the point defect 19 may be changed from cylindrical to conical, or the diameter of the point defect 19 may vary between upper and lower levels of the slab 15. With this configuration, the wavelength demultiplexer 8 enables light to be emitted in only the direction of greater thickness of the PC. In this case, the wavelength demultiplexer 8 may be disposed such that the laser oscillating region 10 and the line defect 12 with a width corresponding to that of the laser oscillating region 10 partially overlap each other. To secure a path through which a laser beam emitted from the wavelength demultiplexer 8 passes, a via hole (not shown in FIG. 1) can preferably be formed by a photolithographic method in a portion of the p-cladding layer 5, the current-blocking region 6 and the electrode layer 7 overlying the point defect 19 of the wavelength demultiplexer 8. The via hole may be covered or blocked by glass that can transmit a laser beam.

Both sides of the multi-beam semiconductor laser A, which are the front and rear longitudinal end surface of the striped laser oscillating region 10, are respectively coated with a front reflective layer 21A having a reflectance of approximately 100% and a rear reflective layer 21B having a reflectance of approximately 80 to 95%. The reflective layers 21A and 21B are formed to cover both end surfaces of the laser oscillating region 10. A reflective mirror on the front surface reflects approximately 100% of light so as to confine a laser oscillating wavelength beam to the laser oscillating region 10 when laser oscillation occurs at the laser oscillating region 10. Thus, the multi-beam semiconductor laser A forbids emission of a laser oscillating wavelength beam through the front surface of the laser oscillating region 10. In a common edge-emitting semiconductor, the reflectance of a reflective layer disposed on an edge is set to approximately 50 to 90%, and the laser oscillating wavelength beam is transmitted and emitted through the reflective layer only when the laser output exceeds a laser oscillation threshold. In the illustrative embodiment, the reflective layer has a reflectance from between approximately 95 to 100%, but preferably 99 to 100%. A method to improve the reflectance may involve forming a plurality of reflective layers in a stack or increasing the thickness of the reflective layer. Since a laser beam or light leaks through the reflective layer 21B on the rear surface, the output of laser can be determined by measuring the intensity of the leaking light.

In the multi-beam semiconductor laser A, electrical current supplied by the electrode layers 1 and 7 is injected into the striped current path 9 and the active layer 3, so that oscillation of a beam occurs at the laser oscillating region 10 in the active layer 3. This oscillation allows light with a particular laser oscillating wavelength beam to be emitted from the wavelength demultiplexer 8 as the EM waves 20 in the vertical direction of the laser oscillating region 10, thereby obtaining laser beams as indicated by beams B3 and B4 in FIG. 6. Since the wavelength demultiplexers 8 are disposed slightly awry from the longitudinal directions of the pair of striped laser oscillating regions 10, it is easy to adjust the pitch P2 between laser beams B3 and B4 to a desired value when the pitch P2 is measured from the sides of the multi-beam semiconductor laser A (the sides of the striped laser oscillating region 10). For example, when the wavelength demultiplexers 8 are disposed at the same position in the longitudinal directions of the laser oscillating regions 10, the pitch P2 between the laser beams B3 and B4 is zero. On the other hand, when the wavelength demultiplexers 8 are disposed slightly apart, the pitch P2 can be determined accordingly. The location of the wavelength demultiplexer 8 in the laser oscillating region 10 can be freely determined. Thus, by adjusting the location of the wavelength demultiplexer 8 for each laser oscillating region 10, it is possible to freely control the spacing (pitch) between a plurality of laser oscillating wavelength beams emitted orthogonally from the wavelength demultiplexer 8. While in a conventional semiconductor laser, the location of a wavelength demultiplexer is limited by the positions of a current-blocking region and a current path formed by a photolithographic method, the present invention removes the restriction imposed due to the use of photolithographic method.

Furthermore, since metal-organic chemical vapor deposition (MOCVD) is used for crystal growth during the manufacturing of a typical laser diode, it is possible to make a wavelength demultiplexer within the laser oscillating region 10 by applying a process described under paragraphs [0038] to [0043] of the official gazette in Japanese Patent Laid-open Publication No. 2001-272555 to the crystal growth process.

Figure 9A:
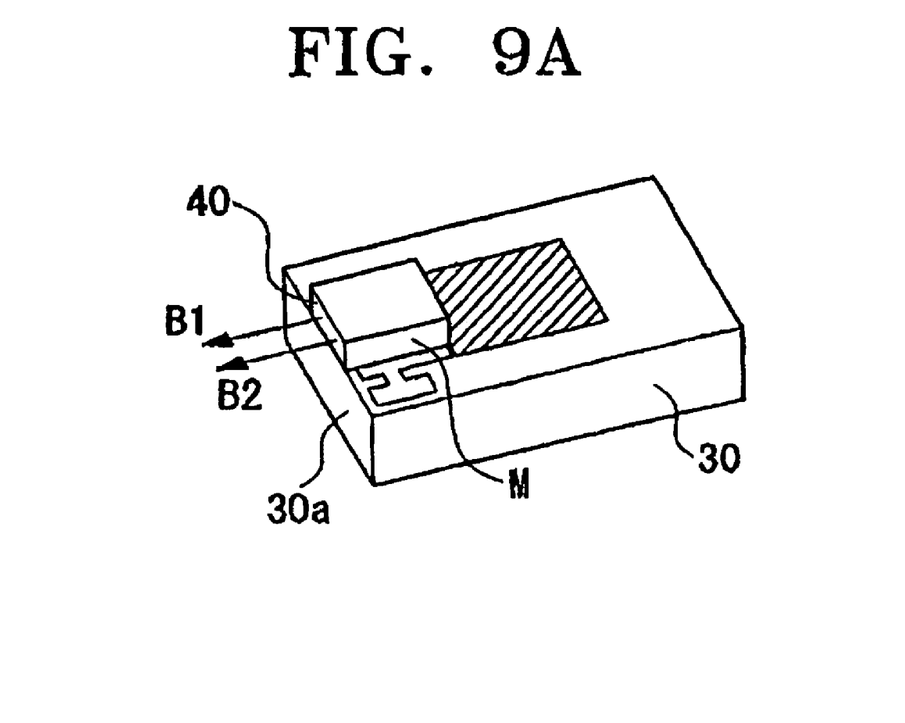
FIG. 9A is a perspective view showing an example of a conventional multi-beam semiconductor laser that is mounted at an edge of a submount.
Figure 9B:
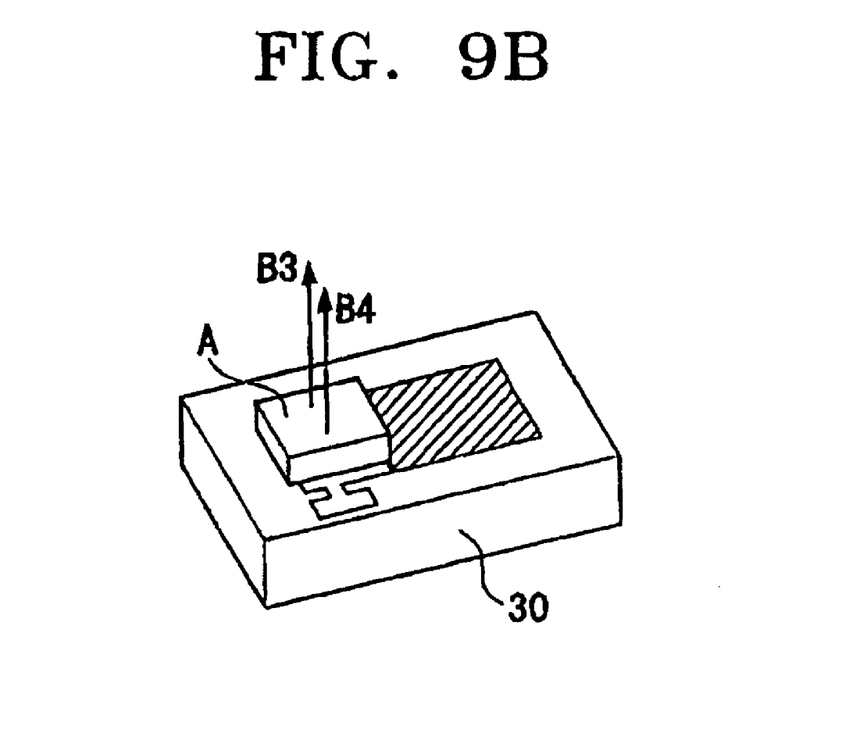
FIG. 9B is an exemplary perspective view of a multi-beam semiconductor laser mounted at the center of the submount according to an embodiment of the present invention.

FIGS. 9A and 9B are perspective views for comparison between a conventional multi-beam semiconductor laser M and the multi-beam semiconductor laser A according to an illustrative embodiment of the present invention.

Since the location of a multi-beam semiconductor laser to be placed on a Si submount must be controlled depending on the location of a light-emitting point, the multi-beam semiconductor laser A eliminates the necessity of fitting its surface to the surface of a submount. For example, referring to FIG. 9A, the conventional edge-emitting multi-beam semiconductor laser M requires an end surface 40 to be precisely fitted to an end surface 30a of the Si submount 30. This is because when the end surface 40 is slightly indented from the end surface 30a of the submount 30, diffraction and interference occur in a far field pattern (FFP). Thus, it is important that an optical element controls the precision of position in the conventional edge emitting semiconductor.

But the multi-beam semiconductor laser A eliminates the need to fit its rear surface to top surface of a Si submount 30 since the rear surface faces the top surface of the Si submount 30. Furthermore, a photodiode (not shown) is disposed on the top surface of the submount 30 and monitors the output power of the multi-beam semiconductor laser A. That is, as described above, the reflective layer 21B on the rear surface has a low reflectance of approximately 80-95% in order to transmit a beam whose intensity is then detected by the photodiode for monitoring.

Figure 10A:
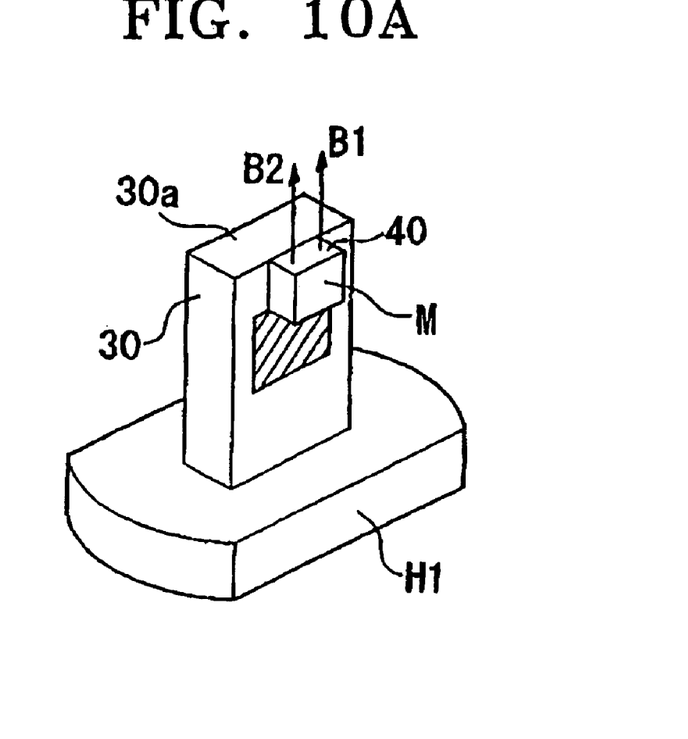
FIG. 10A is perspective view of an example of a submount on which a conventional multi-beam semiconductor laser is placed when attached to a heat sink.
Figure 10B:
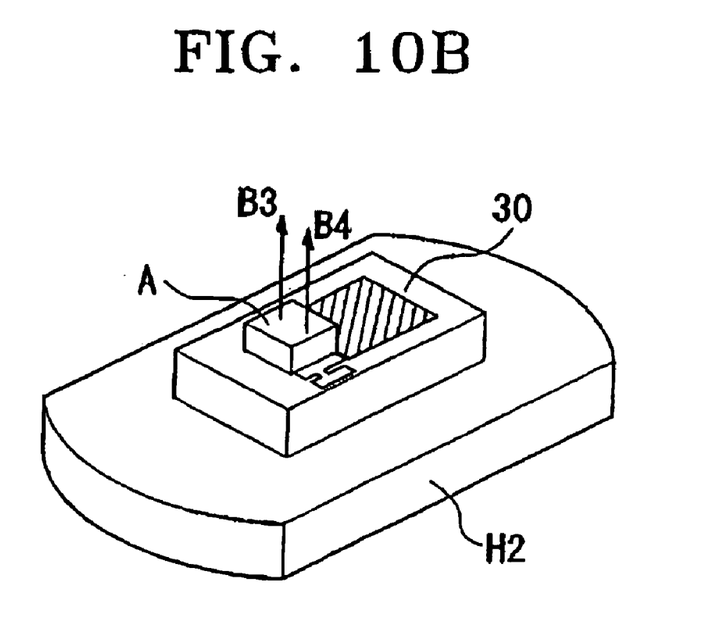
FIG. 10B is an exemplary perspective view of a submount on which a multi-beam semiconductor laser of an embodiment of the present invention is placed when attached to a heat sink.

FIG. 10A shows an example of the submount on which the conventional edge-emitting multi-beam semiconductor laser M is placed when attached to a heat sink. While FIG. 10B shows an exemplary perspective of the submount on which the edge-emitting multi-beam semiconductor laser A is placed when attached to a heat sink according to an embodiment of the present invention. Referring to FIG. 10A, the conventional edge-emitting multi-beam semiconductor laser M is mounted on the Si submount 30, which stands perpendicular to a plate H1 of a heat sink system. On the other hand, referring to FIG. 10B, the edge-emitting multi-beam semiconductor laser A of an embodiment of the present invention is mounted on the Si submount 30, which lies on a plate H2 of a heat sink system, thus affording a broader contact surface to the heat sink and improved thermal diffusion efficiency.

Figure 11:
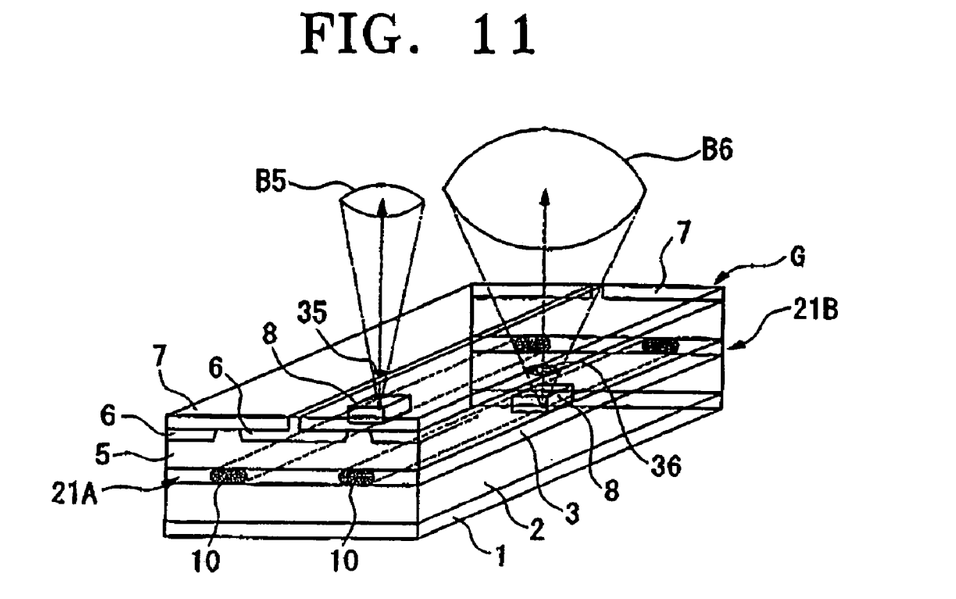
FIG. 11 shows a multi-beam semiconductor laser according to an embodiment of the present invention.

FIG. 11 shows a multi-beam semiconductor laser G according to an embodiment of the present invention. Major portions in the multi-beam semiconductor laser G have substantially the equivalent construction as those in the multi-beam semiconductor laser A, and the same reference numerals denote the corresponding elements, and thus their description will not be given. The multi-beam semiconductor laser G further comprises gratings 35 and 36 that are disposed in the direction of a laser beam and control the radiation angles of laser beams B5 and B6. For example, a grating with grooves may be placed into the bottom of a hole for transmitting a laser beam that is formed in an electrode 7.

In the illustrative embodiment shown in FIG. 11, the spacing lattice interval of the gratings 35 and 36 is adjusted such that the radiation angle of the laser beam B6 passing through the grating 36 is greater than that of the laser beam B5 passing through the grating 35. As is well known in the art, either grating 35 or 36 is realized by forming an array of fine, parallel, equally spaced grooves along one side of a grating layer. The holes through which the laser beams B5 and B6 pass through are formed in the electrode layer 7, and then the grooves on the gratings 35 or 36 are formed in the bottom of the hole. More specifically, a grating layer is formed below the electrode layer 7, and grooves on the grating layer are formed on the inner wall of the hole.

Figure 12:
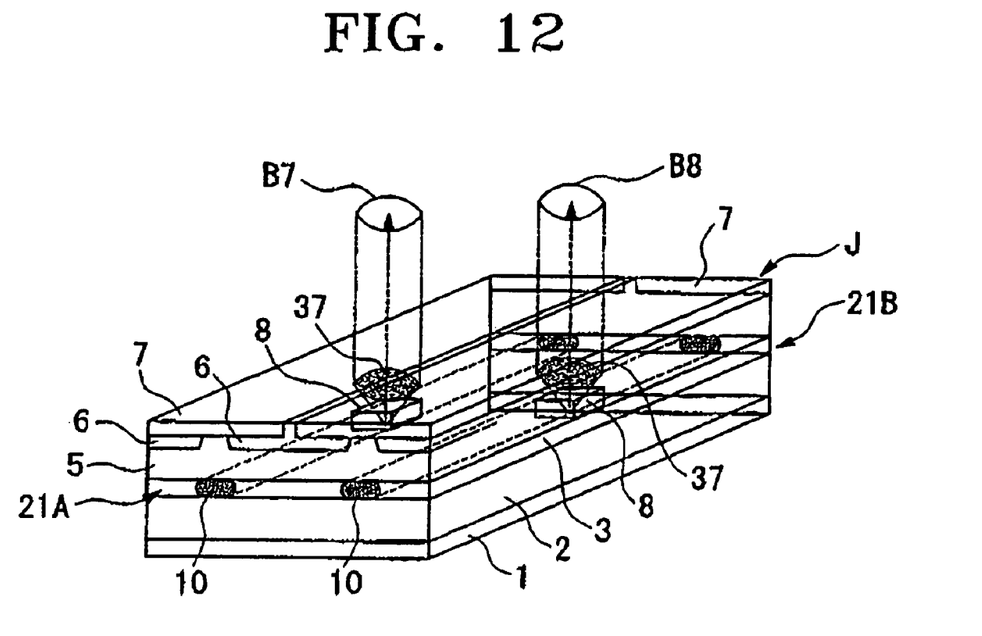
FIG. 12 shows a multi-beam semiconductor laser according to an embodiment of the present invention.

FIG. 12 shows a multi-beam semiconductor laser J according to an embodiment of the present invention. Major portions in the multi-beam semiconductor laser J have substantially the equivalent construction as those in the multi-beam semiconductor laser A and the same reference numerals denote the corresponding elements. Thus, their description will not be given . . . The multi-beam semiconductor laser J further comprises gratings 37 having the equivalent structure as those shown in FIG. 11 that ensures that either laser beam B7 or B8 is parallel.

Figure 13:
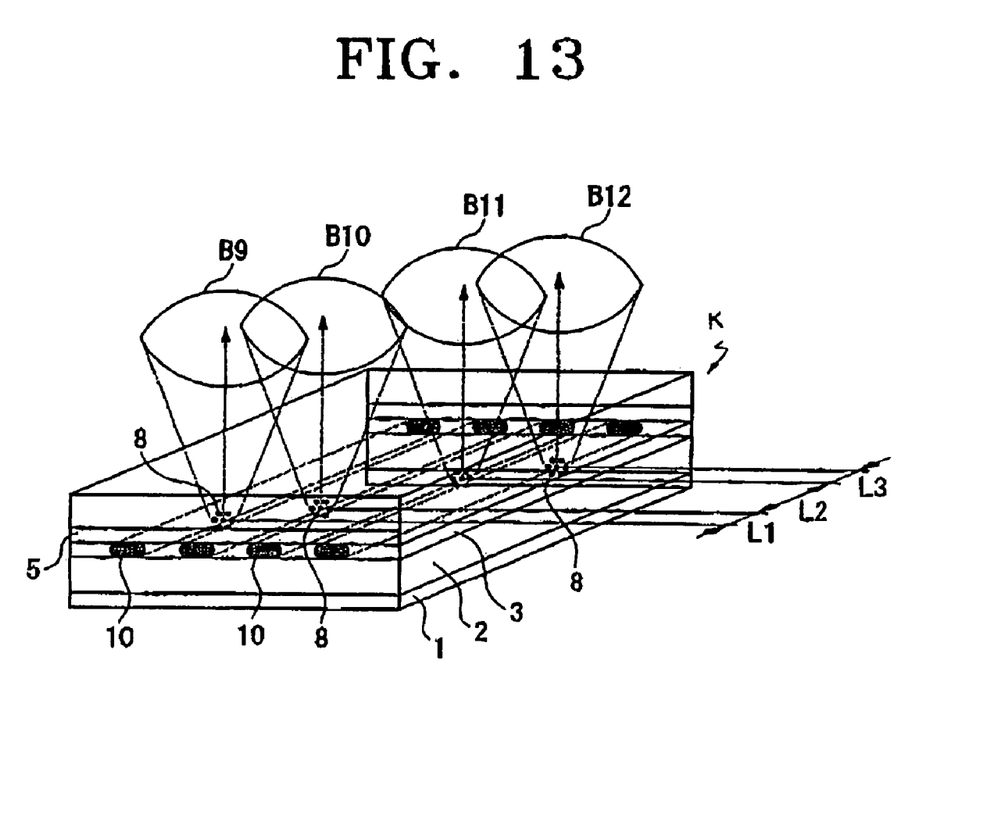
FIG. 13 shows a multi-beam semiconductor laser according to an embodiment of the present invention.

FIG. 13 shows a multi-beam semiconductor laser K according to yet another embodiment of the present invention. Major portions in the multi-beam semiconductor laser J have substantially the equivalent construction as those in the multi-beam semiconductor laser A, and the same reference numerals denote the corresponding elements. Thus, their description will not be given.

The multi-beam semiconductor laser K comprises four electrode layers, four striped current paths, and four laser oscillating regions 10, each having a wavelength demultiplexer 8 formed from PCs. For better visualization, the shape of the wavelength demulitplexer 8 is not shown in FIG. 13. By controlling the location of the wavelength demultiplexer 8 installed, it is possible to freely adjust the spacing L1 between B9 and B10, L2 between B10 and B11, and L3 between B11 and B12.

According to an embodiment of the present invention, when electrical current is injected into a current path and hence into an active layer by an electrode layer, laser oscillation occurs at a laser oscillating region in the active layer. Since a laser oscillating wavelength beam cannot be emitted from a reflective mirror on an edge of the laser oscillating region, the optical path of the laser oscillating wavelength beam produced in the laser oscillating region is converted by a wavelength demultiplexer for emission.

The emitted laser oscillating wavelength beam is obtained as the output of a laser. Here, since the location of the wavelength demultiplexer can be freely determined within the laser oscillating region, it is possible to control the spacing between a plurality of laser oscillating wavelength beams, the optical paths of which are changed by appropriate wavelength demultiplexers for emission, according to the location of the wavelength demultiplexer for each of the plurality of laser oscillating regions. The spacing (pitch) between the plurality laser oscillating wavelength beams emitted from the wavelength demultiplexers can be set to a desired value including zero when the pitch is measured from an optical path of the laser oscillating wavelength beam.

Furthermore, embodiments of the present invention make it possible to adjust the spacing between laser oscillating wavelength beams without affecting the design of major portions of a semiconductor laser such as active layer, cladding layer and electrode layer, even if the locations or shapes of the active layer, cladding layer, and electrode layer are the same as in a conventional semiconductor laser. That is, embodiments of the present invention provide a novel multi-beam semiconductor laser designed to adjust a pitch between beams without changing the electrical characteristics, laser beam output power, and reliability characteristics by minimizing a change to crystal formation in each layer and manufacturing processes in the existing edge-emitting multi-beam semiconductor laser.

As described above, the pitch between a plurality of laser beams whose optical paths are converted by a plurality of wavelength demultiplexers for emission can be adjusted according to the location of each wavelength demultiplexer. When reflective mirrors located on end surfaces of the laser oscillating region reflects almost 100% of light, the reflective mirrors prevent emission of a laser oscillating wavelength beam from the laser oscillating region, and the use of the reflective mirrors ensure that the laser oscillating wavelength beam is emitted through the wavelength demultiplexer. The optical path of the beam is converted by the wavelength demulitplexer for emission through a transmission path. Furthermore, a grating disposed in a transmission path through which a laser beam passes allows a laser beam to be output as parallel beams or radiation beams at a desired radiation angle by controlling the radiation angle of a laser oscillating wavelength beam. The wavelength multiplexer formed from PCs effectively changes the direction of propagation of a laser oscillating wavelength beam.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A multi-beam semiconductor laser comprising an active layer, two cladding layers on either side of the active layer in a thickness direction, electrode layers formed outside of the cladding layers, a current-blocking region formed from an insulating layer at an interface between one of the two cladding layers and the electrode layer, a striped current path formed in the current-blocking region, and a plurality of light-emitting portions defining laser oscillating regions formed in the active layer along the current path, wherein reflective mirrors are disposed at either end surface of the laser oscillating region in the active layer formed along the striped current path, a reflective mirror located at a front surface has a reflectance sufficiently high to prevent emission of a laser beam from the front surface, and a wavelength demultiplexer is disposed at a location in each of the plurality of laser oscillating regions so as to change the direction of propagation of only laser oscillating wavelength beams for emission from the laser oscillating regions; wherein a spacing between a plurality of laser beams, the propagation paths of which are changed by the plurality of laser oscillating regions and the wavelength demultiplexers disposed within the plurality of laser oscillating regions, is adjusted according to the location of each of the plurality of wavelength demultiplexers in the laser oscillating region.

2. The multi-beam semiconductor laser of claim 1, wherein the reflectance of the reflective mirror located at the front surface is approximately 100%.

3. The multi-beam semiconductor laser of claim 1, wherein a path through which the laser oscillating wavelength beam passes is disposed in the direction of propagation of the laser oscillating wavelength beam changed by the wavelength demultiplexer.

4. The multi-beam semiconductor laser of claim 1, further comprising a grating that is disposed on the path through which the laser oscillating wavelength beam whose propagation path is changed by the wavelength demultiplexer passes and controls the radiation angle of a beam.

5. The multi-beam semiconductor laser of claim 1, wherein the wavelength demultiplexer is formed from photonic crystals.

6. The multi-beam semiconductor laser of claim 1, further comprising a grating that is disposed on the path through which the laser oscillating wavelength beam whose propagation path is changed by the wavelength demultiplexer passes and controls beams to be parallel.

7. A multi-beam semiconductor laser comprising:

an active layer, two cladding layers on either side of the active layer in a thickness direction, electrode layers formed outside of the cladding layers, a current-blocking region formed from an insulating layer at an interface between one of the two cladding layers and the electrode layer, a striped current path formed in the current-blocking region, and a plurality of light-emitting portions defining laser oscillating regions formed in the active layer along the current path, wherein reflective mirrors are disposed at either end surface of the laser oscillating region in the active layer formed along the striped current path, a reflective mirror located at a front surface has a reflectance sufficiently high to prevent emission of a laser beam from the front surface, and a wavelength demultiplexer is disposed at a location in each of the plurality of laser oscillating regions so as to change the direction of propagation of only laser oscillating wavelength beams for emission from the laser oscillating regions, wherein a spacing between a plurality of laser beams is adjusted according to the location of each of the plurality of wavelength demultiplexers in the laser oscillating region.

* * * * *